(12) United States Patent
Kamei

(10) Patent No.: US 6,365,923 B1
(45) Date of Patent: Apr. 2, 2002

(54) NITRIDE SEMICONDUCTOR LIGHT-EMITTING ELEMENT AND PROCESS FOR PRODUCTION THEREOF

(75) Inventor: Hidenori Kamei, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/556,317

(22) Filed: Apr. 24, 2000

(30) Foreign Application Priority Data

Sep. 30, 1999 (JP) .......................................... 11-278714

(51) Int. Cl.⁷ .............................................. H01L 33/00
(52) U.S. Cl. ........................ 257/103; 257/94; 257/101; 257/102; 372/45; 372/46
(58) Field of Search .......................... 257/94, 101, 102, 257/103; 372/45, 46

(56) References Cited

U.S. PATENT DOCUMENTS

| | | | |
|---|---|---|---|
| 5,751,013 A | * 5/1998 | Kidoguchi et al. | ........... 257/13 |
| 5,932,896 A | 8/1999 | Sugiura et al. | |
| 5,998,810 A | * 12/1999 | Hatano et al. | ............... 257/102 |
| 6,242,761 B1 | * 6/2001 | Fujimoto et al. | .............. 257/94 |

FOREIGN PATENT DOCUMENTS

| | | |
|---|---|---|
| JP | 10135575 | 5/1998 |
| JP | 10178213 A | * 6/1998 |

OTHER PUBLICATIONS

L. Sugiura et al., "p–type conduction in as–grown Mg–doped GaN grown by metalorganic chemical vapor deposition," Applied Physics Letters, vol. 72, No. 14, Apr. 6, 1998, pp. 1748–1750.

* cited by examiner

Primary Examiner—Nathan Flynn
Assistant Examiner—Remmon R. Fordé
(74) Attorney, Agent, or Firm—Stevens, Davis, Miller & Mosher, LLP

(57) ABSTRACT

A nitride semiconductor light-emitting element containing an n-type layer, a light-emitting layer on the n-type layer, a first p-type layer on the light-emitting layer and a second p-type layer on the first p-type layer, the first p-type layer containing hydrogen element and a p-type impurity element, the second p-type layer containing hydrogen element and a p-type impurity element which is the same as or different from the p-type impurity element in the first p-type layer, and the ratio of hydrogen element to the p-type impurity element in the first p-type layer being lower than the ratio of hydrogen element to the p-type impurity element in the second p-type layer, can be produced by a process including the steps of (a) allowing the first p-type layer to grow by a metal organic chemical vapor deposition method in a reaction tube and (b) allowing the second p-type layer to grow by a metal organic chemical vapor deposition method in the reaction tube, the hydrogen content in the total mixture of gases fed into the reaction tube in step (a) being lower than the hydrogen content in the total mixture of gases fed into the reaction tube in step (b).

15 Claims, 1 Drawing Sheet

NITRIDE SEMICONDUCTOR LIGHT-EMITTING ELEMENT AND PROCESS FOR PRODUCTION THEREOF

BACKGROUND OF THE INVENTION

The present invention relates to a nitride semiconductor light-emitting element used in optical devices such as light-emitting diodes, semiconductor laser diodes, etc., and a process for producing said element.

Nitride semiconductors containing Group III elements such as Al, Ga and In and a Group V element such as N and represented by AlGaInN have come to be often used in these years as semiconductor materials for visible-light-emitting devices and high-temperature working electron devices. Particularly, their practical application in the field of blue and green light-emitting diodes and their development in the field of bluish-purple laser diodes are now in progress.

For producing light-emitting elements by using such nitride semiconductors, a process of allowing nitride semiconductor thin-film crystals to grow by a metal organic chemical vapor deposition method has recently been a leading process. This process comprises feeding gaseous sources of Group III elements such as metal organic compound gases, e.g., trimethylgallium (hereinafter abbreviated as TMG), trimethylaluminum (hereinafter abbreviated as TMA) and trimethylindium (hereinafter abbreviated as TMI), and a gaseous source of Group V element such as ammonia, hydrazine or the like, into a reaction tube in which is placed a substrate made of, for example, sapphire, SiC and GaN, and maintaining the substrate at elevated temperatures of approximately 700° C.–1100° C. to allow an n-type layer, a light-emitting layer and a p-type layer to grow to make a laminate on the substrate. The n-type layer is allowed to grow while feeding monosilane ($SiH_4$), germane ($GeH_4$) or the like as gaseous source of n-type impurity elements together with the gaseous sources of Group III elements. The p-type layer is allowed to grow while feeding cyclopentadienylmagnesium ($Cp_2Mg$), dimethylzinc ($Zn(CH_3)_2$) or the like as gaseous source of p-type impurity elements together with the gaseous source of Group III element.

After the growth and formation of the nitride semiconductor thin-film crystals on the substrate, an n-side electrode and a p-side electrode are formed on the n-type layer surface and the p-type layer surface, respectively, for example, by a metal vapor deposition method. The product thus obtained is separated into chips in the step of dicing to obtain light-emitting elements.

In nitride semiconductors, p-type conduction has been difficult to attain but has recently become controllable by an electron beam irradiation method or an annealing method. Thus, a nitride semiconductor doped with a p-type impurity element is allowed to grow, and then, the p-type impurity element is activated to function as an acceptor by breaking the bond between hydrogen and the p-type impurity element (the p-type impurity element has been inactivated by the bonding with the hydrogen) by electron beam irradiation method or annealing method and releasing the hydrogen from the nitride semiconductor. As the result, the nitride semiconductor can be made into a p-type semiconductor. In particular, the annealing method is considered to be a practical production method, because it requires a simple equipment therefor and a short time for making the nitride semiconductor into a p-type semiconductor, as well as the nitride semiconductor can be made into a p-type semiconductor uniformly also in the direction of depth of the nitride semiconductor.

However, in the annealing method, impurities such as oxygen and carbon tend to intrude into the nitride semiconductor film through the nitride semiconductor surface during heat treatment, so that the impurities are present particularly in the vicinity of the surface. Said method, in which hydrogen is expelled from the thin film crystal by breaking the bond between the p-type impurity and hydrogen, cannot achieve complete hydrogen expelling from the crystal, so that the presence of hydrogen preferentially in the vicinity of the nitride semiconductor surface is unavoidable. Thus, there has been the following problem: an electrode formed on a p-type nitride semiconductor containing hydrogen, oxygen, carbon and the like preferentially in the vicinity of the surface does not exhibit satisfactory ohmic characteristics.

For solving this problem, for example, JP-A-10-135575 has proposed a method comprising suppressing the formation of a bond between a p-type impurity and hydrogen by reducing the amount of hydrogen contained as a carrier gas in an atmosphere gas in a reaction tube, during the metal organic chemical vapor deposition of a nitride semiconductor doped with the p-type impurity, and attaining p-type conduction without any treatment after the deposition. Appl. Phys. Lett. Vol. 72, No. 14, p. 1748 (1998) contains detailed experimental results obtained by the study group which show that satisfactory p-type conduction is attained at a hydrogen content of 2.4% or less. According to this report, inactivation by hydrogen occurs at a hydrogen content of 3.7% or less.

However, when the nitride semiconductor is allowed to grow at a low hydrogen content of the carrier gas as proposed by the prior art above, the migration of atoms on the semiconductor crystal surface is suppressed, so that the crystallinity is more easily deteriorated at the low hydrogen content than at a high hydrogen content. Therefore, when the whole of p-type layer is uniformly formed at a low hydrogen content in the carrier gas, the crystallinity is deteriorated particularly in the upper portion of the p-type layer. Consequently, a satisfactory ohmic contact is difficult to obtain between the p-type layer and the p-side electrode formed on the outermost surface of the p-type layer, resulting in undesirable influences on the light-emitting characteristics of the resultant light-emitting element.

SUMMARY OF THE INVENTION

An object of the present invention is to provide a nitride semiconductor light-emitting element which is synthetically designed to possess desirable harmony between the p-type electric properties and crystallinity in the p-type layer, is excellent in light-emitting properties, and requires only a low operating voltage owing to the satisfactory ohmic contact.

The present inventor earnestly investigated the structure of p-type layer in nitride semiconductor light-emitting elements. As a result, he found that formation of the p-type layer out of at least two plies, the first p-type sublayer in contact with a light-emitting layer and the second p-type sublayer provided so as to farther distanced from the light-emitting layer than the first p-type sublayer, by allowing the first p-type sublayer to grow in an atmosphere gas having a low hydrogen content and allowing the second p-type sublayer to grow in an atmosphere gas having a hydrogen content higher than that used for allowing the first p-type sublayer to grow, achieves, in the first p-type sublayer, high activation rate of the p-type impurity which keeps the hole content high and, in the second p-type sublayer, restoration of the deteriorated crystallinity of the first p-type sublayer.

By the above features it becomes possible to obtain a light-emitting element excellent in both p-type electric properties and crystallinity in the p-type layer.

He also found a process for producing a nitride semiconductor light-emitting element comprising an n-type layer, a light-emitting layer and a p-type layer accumulated in this order, said p-type layer being a laminate comprising at least two p-type sublayers, the first p-type sublayer in contact with a light-emitting layer and the second p-type sublayer provided so as to farther distanced from the light-emitting layer than the first p-type sublayer, wherein at least the p-type layer is allowed to grow by a metal organic chemical vapor deposition method, which process comprises the steps of (a) allowing the first p-type sublayer to grow by a metal organic chemical vapor deposition method in a reaction tube and (b) allowing the second p-type sublayer to grow by a metal organic chemical vapor deposition method in the reaction tube, the hydrogen content in the total mixture of gases fed into the reaction tube in step (a) being lower than the hydrogen content in the total mixture of gases fed into the reaction tube in step (b), leading to, in the first p-type sublayer, high activation rate of the p-type impurity which keeps the hole content high and, in the second p-type sublayer, restoration of the deteriorated crystallinity of the first p-type sublayer.

When such a production process is adopted, it becomes possible to produce a light-emitting element excellent in both p-type electric characteristics and crystallinity in the p-type layer.

DETAILED DESCRIPTION OF THE INVENTION

The embodiments according to the present invention are explained below with reference to the drawings.

Figure 1:
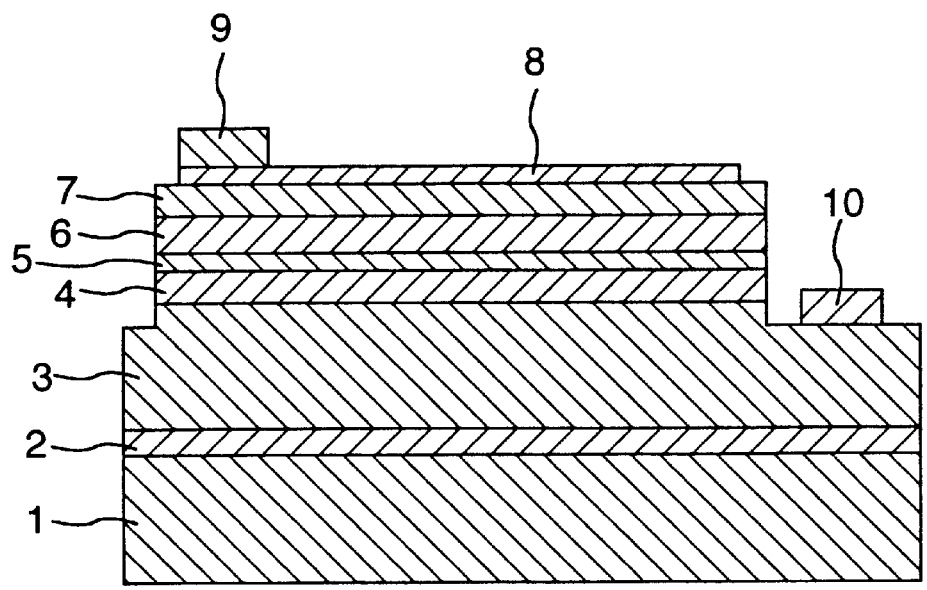
FIG. 1 is a cross-sectional view showing the structure of a gallium nitride-based compound semiconductor light-emitting element according to an embodiment of the present invention.

FIG. 1 is a cross-sectional view showing an embodiment of the structure of a gallium nitride-based compound semiconductor light-emitting element according to the present invention.

In FIG. 1, n-type contact layer 3, n-type clad layer 4, light-emitting layer 5, p-type clad layer 6 as first p-type sublayer, and p-type contact layer 7 as second p-type sublayer are laminated in this order on substrate 1 through buffer layer 2. Light-transmitting electrode 8 is formed substantially all over the surface of p-type contact layer 7. p-Side electrode 9 for wire bonding is provided on the light-transmitting electrode 8. n-Side electrode 10 is provided on the surface of n-type contact layer 3 which has partly been bared by etching to such a depth that the etching extends from a portion of the surface of p-type contact layer 7 to n-type contact layer 3.

As substrate 1, sapphire, GaN, SiC, etc. can be used.

As buffer layer 2, GaN, AlN, AlGaN, InGaN, etc. can be used. For example, a layer of any of these material formed at a temperature of 900° C. or lower so as to have a thickness of several nanometers to tens nanometers can be preferably used. Buffer layer 2 is provided for reducing the lattice unconformity between substrate 1 and the laminated structure of nitride semiconductors formed thereon. Therefore, when a substrate, such as a GaN substrate, having a lattice constant similar to that of a nitride semiconductor formed thereon is used, the formation of buffer layer 2 can be omitted depending on the growing method and growing conditions.

n-Type contact layer 3 is formed of a nitride semiconductor and is preferably formed of, in particular, GaN or AlGaN. Nitride semiconductors tend to have n-type electroconductivity even in an undoped state in which they have not been doped with an n-type impurity element. Particularly when a nitride semiconductor is used as the n-type contact layer carrying n-side electrode 10 thereon, employment of GaN doped with an n-type impurity element such as Si or Ge imparts a high electron concentration to the n-type layer and hence permits reduction of the contact resistance between the n-type layer and n-side electrode 10.

The n-type clad layer 4 is formed of a nitride semiconductor, preferably $Al_aGa_{1-a}N$ (wherein $0 \leq a \leq 1$) doped with an n-type impurity such as Si or Ge. In the case where a light-emitting diode is intended, the formation of n-type clad layer 4 can be omitted.

Light-emitting layer 5 is formed of a nitride semiconductor having a bandgap smaller than that of n-type clad layer 4. It is formed of, in particular, a nitride semiconductor containing indium, i.e., $In_pAl_qGa_{1-p-q}N$ (wherein $0<p \leq 1$, $0 \leq q \leq 1$ and $0<p+q \leq 1$), and is preferably formed of $In_bGa_{1-b}N$ (wherein $0<b<1$). In the present specification, a nitride semiconductor represented by the formula $In_bGa_{1-b}N$ or a similar formula containing suffixes is hereinafter referred to merely as InGaN in some cases. Light-emitting layer 5 can be formed so as to have a desirable emission wavelength, by doping with both an n-type impurity element and a p-type impurity element or only one of them. It is especially preferable to form light-emitting layer 5 of quantum well structure with a thin layer having a thickness of about 10 nm or less so as to impart a high color purity and emission efficiency to the layer. When light-emitting layer 5 is of quantum well structure, it may be of single-quantum-well structure formed by holding a well layer of InGaN between barrier layers having a bandgap larger than that of the well layer. In this case, the p-type and n-type clad layers formed on both sides, respectively, of the light-emitting layer can be used also as the barrier layers. The light-emitting layer may also be of multiple-quantum-well structure formed by laminating well layers and barrier layers alternately.

p-Type clad layer 6 as first p-type sublayer is formed of a nitride semiconductor having a bandgap larger than that of light-emitting layer 5, and is preferably formed of $In_uAl_vGa_{1-u-v}N$ (wherein $0 \leq u<1$, $0 \leq v<1$ and $0 \leq u+v<1$) doped with a p-type impurity element. p-Type clad layer 6 is usually formed at a growth temperature higher than a temperature suitable for the growth of light-emitting layer 5 in order to grow p-type clad layer 6 with a high crystallinity. Therefore, the crystallinity of light-emitting layer 5 is deteriorated in some cases by the decomposition of elements (e.g., indium and nitrogen) constituting light-emitting layer 5, during heating to a temperature suitable for the growth of p-type clad layer 6 after the growth of light-emitting layer 5. The deterioration of the crystallinity of light-emitting layer 5 can be effectively prevented when a portion of p-type clad layer 6 on the light-emitting layer 5 side is formed by continuous growth with heating after the growth of light-emitting layer 5, and the other portion of p-type clad layer 6 is subsequently allowed to grow at a temperature suitable for the growth of p-type clad layer 6. In this case, the portion of p-type clad layer 6 to be grown with heating is preferably formed of $In_xAl_yGa_{1-x-y}N$ (wherein $0 \leq x<1$, $0 \leq y<1$, $0 \leq x+y<1$ and $x<y$), in particular, GaN. This is because the layer of such a material formed in contact with light-emitting layer 5 can function as a clad layer sufficiently, as well as enhance the preventive effect on the deterioration of the crystallinity by, for example, the decomposition of elements constituting light-emitting layer 5. As the p-type impurity element for doping p-type clad layer 6, Mg, Zn, Be, Cd, etc. can be used. Of these, Mg is preferably used because it easily gives p-type conduction and is easy to handle.

p-Type contact layer 7 as second p-type sublayer is formed of a nitride semiconductor doped with a p-type impurity element. In particular, p-type contact layer 7 is preferably formed of $In_cGa_{1-c}N$ (wherein $0 \leq c<1$) doped with a p-type impurity element such as Mg and having a bandgap smaller than that of p-type clad layer 6, in order to reduce the contact resistance between p-type contact layer 7 and p-side electrode 9 to be formed on the surface of p-type contact layer 7. As the p-type impurity element for doping p-type contact layer 7, Mg, Zn, Be, Cd, etc. can be used. Of these, Mg is preferably used because it easily gives p-type conduction and is easy to handle.

p-Type clad layer 6 and p-type contact layer 7 are allowed to grow in a manner such that in their successive growth by a metal organic chemical vapor deposition method, the hydrogen content in the total mixture of gases fed into the reaction tube in the step of allowing p-type clad layer 6 to grow is lower than the hydrogen content in the total mixture of gases fed into the reaction tube in the step of allowing p-type contact layer 7 to grow. The ratio of hydrogen element to the p-type impurity element in p-type clad layer 6 should be thus adjusted so as to be lower than the ratio of hydrogen element to the p-type impurity element (which is the same as or different from the p-type impurity element in p-type clad layer 6) in p-type contact layer 7.

The hydrogen content in the atmosphere gas in the reaction tube during the growth of p-type clad layer 6 can be selected in the range of from 0% by volume to 20% by volume, preferably from 0% by volume to 5% by volume. By selecting the hydrogen content in the range of from 0% by volume to 5% by volume, the ratio of hydrogen element to p-type impurity element in the chemical vapor deposition film in growth process can be limited to about 0.5 or less, so that the p-type impurity is easily activated as an acceptor.

On the other hand, the hydrogen content in the atmosphere gas in the reaction tube during the growth of p-type contact layer 7 may be selected in the range of from 0% by volume to 50% by volume, preferably from 10% by volume to 20% by volume. By selecting the hydrogen content in the range of from 0% by volume to 50% by volume, the ratio of hydrogen element to p-type impurity element in the chemical vapor deposition film in growth process can be limited to about 1 or less to facilitate the activation of the p-type impurity as an acceptor, and at the same time, the migration of atoms on the surface of the chemical vapor deposition film in growth process can be accelerated to enhance the crystallinity of the chemical vapor deposition film.

The growth and formation of p-type clad layer 6 and p-type contact layer 7 in the above manner permit increase of the rate of activation of the p-type impurity in the p-type layer composed of the two layers 6 and 7 while maintaining the high hole content therein. Particularly, the rate of activation of the p-type impurity in p-type clad layer 6 can be more markedly increased, so that the efficiency of introduction of holes into light-emitting layer 5, which contacts p-type clad layer 6, is increased. Moreover, the inhibitory effect on electron leakage from light-emitting layer 5 into p-type clad layer 6 is enhanced. As a result, the light emission efficiency can be increased.

It is considered that reduction of the hydrogen content during the growth of p-type clad layer 6 tends to decrease the crystallinity. However, the crystallinity deteriorated during the growth of p-type clad layer 6 can be restored in p-type contact layer 7 laminated on p-type clad layer 6. Therefore, the following effects can be obtained: suppression of the ohmic contact resistance between p-type contact layer 7 and the electrodes formed on the surface of p-type contact layer 7, i.e., light-transmitting electrode 8 and p-side electrode 9, to a low value; reduction of the operating voltage of the element; and improved reliability.

The laminated structure of the nitride semiconductors allowed to grow and formed on substrate 1 in the manner described above need not be subjected to a special treatment such as annealing for activating the p-type impurity. However, when the laminated structure is annealed, the annealing should be carried out rapidly in a clean atmosphere in order to prevent contamination with oxygen and carbon.

Figure 2:
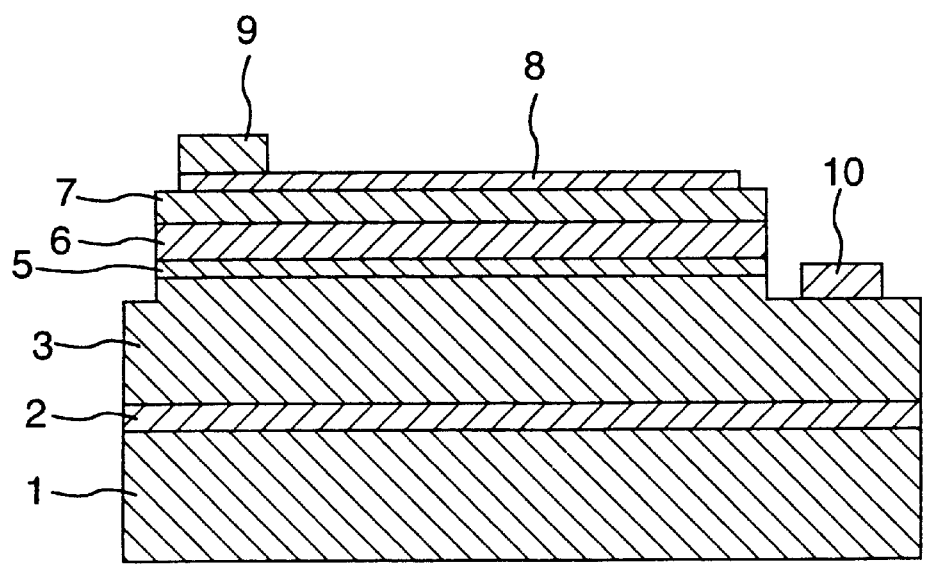
FIG. 2 is a cross-sectional view showing the structure of a gallium nitride-based compound semiconductor light-emitting element according to another embodiment of the present invention.

A specific example of the process for producing the nitride semiconductor light-emitting element of the present invention is explained below with reference to FIG. 2.

First, sapphire substrate 1 having a planished main surface was set on a substrate holder in a reaction tube. It was heated for 10 minutes while introducing nitrogen and hydrogen each at a rate of 5 liters/min into the reaction tube and maintaining the temperature of substrate 1 at 1,000° C., to remove water and smudges of organic substances, etc. which had been adhering to the surface of substrate 1.

Then, the temperature of substrate 1 was lowered to 550° C. Ammonia and TMG were fed into the reaction tube at rates of 4 liters/min and 40 μmol/min, respectively, while introducing nitrogen as a carrier gas at a rate of 16 liters/min into the reaction tube, to grow buffer layer 2 of GaN in 25 nm thickness.

Subsequently, the feeding of TMG was stopped, and the temperature of substrate 1 was raised to 1,050° C. Thereafter, ammonia, TMG and a 10 ppm $SiH_4$ dilution were fed at rates of 4 liters/min, 80 μmol/min and 10 cc/min, respectively, while introducing nitrogen and hydrogen as carrier gases at rates of 13 liters/min and 3 liters/min, respectively, into the reaction tube, to allow n-type contact layer 3 of Si-doped GaN to grow in 2 μm thickness. The electron concentration of the thus grown n-type contact layer 3 was $1.5 \times 10^{18}/cm^3$.

After the growth of n-type contact layer 3, the feeding of TMG and $SiH_4$ was stopped, and the temperature of substrate 1 was lowered to 750° C. Ammonia, TMG and TMI were fed into the reaction tube at rates of 6 liters/min, 4 μmol/min and 5 μmol/min, respectively, while maintaining the temperature of substrate 1 at 750° C. and introducing nitrogen as a carrier gas at a rate of 14 liters/min into the reaction tube, to allow single-quntum-well, light-emitting layer 5 of undoped $In_{0.2}Ga_{0.8}N$ to grow in 2 nm thickness.

After the growth of light-emitting layer 5, the feeding of TMI was stopped, and undoped GaN (not shown) was subsequently allowed to grow in 4 nm thickness while feeding TMG into the reaction tube and raising the temperature of substrate 1 toward 1,050° C. When the temperature of substrate 1 reached 1,050° C., ammonia, TMG, TMA and $Cp_2Mg$ were fed into the reaction tube at rates of 2 liters/min, 40 μmol/min, 3 μmol/min and 0.10 μmol/min, respectively, while introducing nitrogen and hydrogen as carrier gases at rates of 17.2 liters/min and 0.8 liter/min, respectively, into the reaction tube, to allow p-type clad layer 6 of Mg-doped $Al_{0.05}Ga_{0.95}N$ to grow in 0.2 μm thickness. In this case, the hydrogen content of the atmosphere gas in the reaction tube was 4%. The thus grown p-type clad layer 6 had an Mg concentration of $1 \times 10^{20}/cm^3$ and a hydrogen concentration of $4 \times 10^{19}/cm^3$.

After the growth of p-type clad layer 6, the feeding of TMA was stopped, and ammonia, TMG and $Cp_2Mg$ were fed into the reaction tube at rates of 4 liters/min, 80 μmol/min and 0.2 μmol/min, respectively, while introducing nitrogen and hydrogen as carrier gases at rates of 13 liters/min and 3 liters/min, respectively, into the reaction tube, to allow p-type contact layer 7 of Mg-doped GaN to grow in 0.3 μm thickness. In this case, the hydrogen content of the atmosphere gas in the reaction tube was 15%. The thus grown p-type contact layer 7 had a Mg concentration of $1 \times 10^{20}/cm^3$ and a hydrogen concentration of $8 \times 10^{19}/cm^3$.

After the growth of p-type contact layer 7, the feeding of TMG and $Cp_2Mg$ was stopped, and the temperature of substrate 1 was lowered to around room temperature while introducing nitrogen and ammonia at rates of 16 liters/min and 4 liters/min, respectively, into the reaction tube. The wafer composed of substrate 1 and the nitride semiconductors laminated thereon was taken out of the reaction tube.

In the above process, the metal organic compounds TMG, TMI, TMA and $Cp_2Mg$ were fed into the reaction tube by vaporization using hydrogen gas, without exception.

On the whole surface of the thus formed laminated structure made of the gallium nitride-based compound semiconductors, nickel (Ni) and gold (Au) were laminated each in 5 nm thickness by vapor deposition without special annealing. Then, light-transmitting electrode 8 was formed by photolithography and wet etching.

Subsequently, an insulating film (not shown) of $SiO_2$ was deposited in 0.5 μm thickness by CVD on light-transmitting electrode 8 and the exposed portion of p-type contact layer 7. A mask of insulating film was formed by photolithography and reactive ion etching so as to cover light-transmitting electrode 8 but leave part of the surface of p-type contact layer 7 uncovered.

p-Type contact layer 7, p-type clad layer 6 and light-emitting layer 5 were removed at the portion uncovered with the thus formed insulating film mask to a depth of about 0.6 μm from the uncovered surface of p-type contact layer 7 by reactive ion etching using a chlorine-containing gas, to bare part of the surface of n-type contact layer 3.

After the above procedure, the insulating film mask was removed by wet etching. A titanium (Ti) layer of 0.1 μm thick and an Au layer of 0.5 μm thick were laminated as p-side electrode 9 and n-side electrode 10, respectively, on a portion of the surface of light-transmitting electrode 8 and a portion of the bared surface of n-type contact layer 3, respectively, by vapor deposition and photolithography. Thereafter, a $SiO_2$ insulating film (not shown) of 0.2 μm thick was formed by plasma CVD and photolithography so as to cover the surface of light-transmitting electrode 8.

Subsequently, sapphire substrate 1 was thinned to a thickness of about 100 μm by abrading the side opposite to the semiconductor-carrying side, and then the resultant wafer was separated into chips by scribing. The chip was attached to a stem with its electrode side upward, after which p-side electrode 9 and n-side electrode 10 of the chip were connected to electrodes, respectively, on the stem through wire.

Then, the resulting assembly was subjected to resin molding to produce a light-emitting diode. When this light-emitting diode was driven at a forward current of 20 mA, it emitted a blue light having a peak wavelength of 470 nm. In this case, the output of emitted light was 2.0 mW and the forward operating voltage was 3.5 V.

Comparative Example 1

For comparison, the same procedure as in the above embodiment according to the present invention was repeated except that p-type contact layer 7 of Mg-doped GaN was allowed to grow in 0.2 μm thickness by feeding ammonia, TMG and $Cp_2Mg$ into the reaction tube at rates of 4 liters/min, 80 μmol/min and 0.2 μmol/min, respectively, while introducing nitrogen and hydrogen as carrier gases at rates of 15.2 liters/min and 0.8 liter/min, respectively, into the reaction tube. In this case, the hydrogen content of the atmosphere gas in the reaction tube was 4% as in the growth of p-type clad layer 6. The thus grown p-type contact layer 7 had a Mg concentration of $1 \times 10^{20}/cm^3$ and a hydrogen concentration of $4 \times 10^{19}/cm^3$. Thereafter, a light-emitting diode was produced in the same manner as in the above embodiment. When this light-emitting diode was driven at a forward current of 20 mA, it emitted a light having a peak wavelength of 470 nm. The output of emitted light was 1.0 mW and the forward operating voltage was 4.0 V.

The half-width of X-ray diffraction rocking curve obtained for the laminated structure of the nitride semiconductors of the above embodiment according to the present invention was 280 seconds, while that of Comparative Example 1 was as large as 360 seconds. That is, the crystallinity was undesirably low in Comparative Example 1.

Comparative Example 2

For further comparison, the same procedure as in the above embodiment according to the present invention was repeated except that p-type clad layer 6 of Mg-doped $Al_{0.05}Ga_{0.95}N$ was allowed to grow in 0.2 μm thickness by feeding ammonia, TMG, TMA and $Cp_2Mg$ into the reaction tube at rates of 2 liters/min, 40 μmol/min, 3 μmol/min and 0.1 μmol/min, respectively, while introducing nitrogen and hydrogen as carrier gases at rates of 15 liters/min and 3 liters/min, respectively, into the reaction tube. In this case, the hydrogen content of the atmosphere gas in the reaction tube was 15% as in the growth of p-type contact layer 7. The thus grown p-type clad layer 6 had a Mg concentration of $1 \times 10^{20}/cm^3$ and a hydrogen concentration of $8 \times 10^{19}/cm^3$. Thereafter, a light-emitting diode was produced in the same manner as in the above embodiment. When this light-emitting diode was driven at a forward current of 20 mA, it emitted light having a peak wavelength of 470 nm. The output of emitted light was 0.8 mW and the forward operating voltage was 4.2 V.

In Comparative Example 2, the half-width of X-ray diffraction rocking curve obtained for the laminated structure of the nitride semiconductors was 270 seconds.

An object of the present invention is to provide a nitride semiconductor light-emitting element that has a high emission efficiency and requires only a low operating voltage because of attainment of a satisfactory contact, and a process for producing said element. The harmony between electric properties and crystallinity is synthetically intended in the p-type layer of the nitride semiconductor light-emitting element by reducing the hydrogen content in the atmosphere gas for the growth of the p-type clad layer to increase the rate of activation of p-type impurity, and by increasing the hydrogen content in the atmosphere gas for the growth of the p-type contact layer to restore the crystallinity.

According to the present invention, the rate of activation of the p-type impurity elements can be increased by keeping low the hydrogen content in the atmosphere gas for allowing the first p-type sublayer in contact with the light-emitting layer to grow, and the crystallinity can be restored by making the hydrogen content in the atmosphere gas for allowing the second p-type sublayer, a sublayer farther than the first p-type sublayer from the light-emitting layer, to grow, higher than that of the hydrogen content in the atmosphere gas for allowing the first p-type sublayer to grow. As a result, it is now possible to provide a nitride semiconductor light-emitting element having an improved output of emitted light, which permits reduction of an operating voltage and realization of satisfactory ohmic contact.

What is claimed is:

1. A nitride semiconductor light-emitting element comprising an n-type layer, a light-emitting layer on the n-type layer and a p-type layer on the light-emitting layer, the p-type layer comprising a first p-type sublayer on the light-emitting layer and a second p-type sublayer on the first p-type sublayer, the first p-type sublayer containing hydrogen element and a p-type impurity element, the second p-type sublayer containing hydrogen element and a p-type impurity element which is the same as or different from the p-type impurity element in the first p-type sublayer, and a molar ratio of hydrogen element to the p-type impurity element in the first p-type sublayer being lower than a molar ratio of hydrogen element to the p-type impurity element in the second p-type sublayer.

2. The element of claim 1, which comprises a substrate under the n-type layer.

3. The element of claim 1, wherein a molar ratio of hydrogen element to the p-type impurity element in the first p-type sublayer is about 0.5 or less, and a molar ratio of hydrogen element to the p-type impurity element in the second p-type sublayer is about 1 or less.

4. The element of claim 1, wherein the first p-type sublayer is formed of $In_uAl_vGa_{1-u-v}N$, in which $0 \leq u < 1$, $0 \leq v < 1$ and $0 \leq u+v < 1$, doped with the p-type impurity element.

5. The element of claim 4, wherein the p-type impurity element is selected from the group consisting of Mg, Zn, Be and Cd.

6. The element of claim 5, wherein the p-type impurity element is Mg.

7. The element of claim 1, wherein the second p-type sublayer is formed of $In_cGa_{1-c}N$, in which $0 \leq c \leq 1$, doped with the p-type impurity element.

8. The element of claim 7, wherein the p-type impurity element is selected from the group consisting of Mg, Zn, Be and Cd.

9. The element of claim 8, wherein the p-type impurity element is Mg.

10. The element of claim 2, which further comprises a buffer layer between the substrate and the n-type layer.

11. The element of claim 1, which further comprises an n-type clad layer between the n-type layer and the light-emitting layer.

12. The element of claim 1, which further comprises a p-type electrode on a light-transmitting electrode on the second p-type sublayer, and an n-side electrode on an etched surface of the n-type layer.

13. The nitride semiconductor light-emitting element of claim 1, wherein said nitride semiconductor light-emitting element is a nitride laser diode.

14. A nitride semiconductor light-emitting element comprising an n-type layer, a p-type layer and a light-emitting layer provided between the n-type layer and the p-type layer, the p-type layer comprising a first portion on the light-emitting layer side of the p-type layer and a second portion provided so as to sandwich the first portion with the light-emitting layer, the first portion containing hydrogen element and a p-type impurity element, the second portion containing hydrogen element and a p-type impurity element which is the name as or different from the p-type impurity element in the first portion, and a molar ratio of hydrogen element to the p-type impurity element present in the first portion being lower than a molar ratio of hydrogen element to the p-type impurity element present in the second portion.

15. The nitride semiconductor light-emitting element of claim 14, wherein said nitride semiconductor light-emitting element is a nitride laser diode.

* * * * *